(12) United States Patent
Lee (10) Patent No.: US 7,145,962 B2
(45) Date of Patent: Dec. 5, 2006

(54) PREDISTORTION DIGITAL LINEARIZER AND GAIN CONTROLLING METHOD THEREOF

(75) Inventor: Jae-Hyuk Lee, Seoul (KR)

(73) Assignee: LG-Nortel Co., Ltd., Seoul (KR)

( * ) Notice: Subject to any disclaimer, the term of this patent is extended or adjusted under 35 U.S.C. 154(b) by 854 days.

(21) Appl. No.: 09/920,853

(22) Filed: Aug. 3, 2001

(65) Prior Publication Data
US 2002/0050372 A1    May 2, 2002

(30) Foreign Application Priority Data
Aug. 4, 2000  (KR) ............................... 2000-45258
May 10, 2001  (KR) ............................... 2001-25475

(51) Int. Cl.
*H04L 25/49* (2006.01)
(52) U.S. Cl. ................................. 375/296
(58) Field of Classification Search ........ 375/229–233, 375/295–297; 324/600, 612, 620; 370/241, 370/249; 455/296; 708/300, 322, 323
See application file for complete search history.

(56) References Cited

U.S. PATENT DOCUMENTS

| | | | |
|---|---|---|---|
| 4,875,045 A * | 10/1989 | Lynch et al. ................ 341/139 |
| 5,170,495 A * | 12/1992 | McNicol et al. ............. 455/116 |
| 5,566,213 A * | 10/1996 | Carsello ....................... 375/344 |
| 5,752,171 A * | 5/1998 | Akiya ........................... 455/126 |
| 6,240,144 B1 * | 5/2001 | Ha ............................... 375/297 |
| 6,567,478 B1 * | 5/2003 | Oishi et al. .................. 375/297 |
| 6,798,843 B1 * | 9/2004 | Wright et al. ................ 375/296 |

FOREIGN PATENT DOCUMENTS

| DE | 2 283 629 A | 5/1995 |
|---|---|---|
| WO | WO 00/08870 | 2/2000 |

* cited by examiner

*Primary Examiner*—Pankaj Kumar
(74) *Attorney, Agent, or Firm*—Fleshner & Kim, LLP (57) ABSTRACT

A predistortion digital linearizer is disclosed. The linearizer includes a predistorter for distorting a digital input signal in the digital domain to have an opposite characteristic to a nonlinear distortion characteristic of a high power amplifier, in accordance with a feedback signal. An adaptation processing unit controls predistortion of the digital input signal using a base band signal outputted from a feedback unit and the digital input signal which has been delayed for a prescribed period of time. Since the input signal of the digital linearizer is directly predistorted in the digital domain, the accuracy of the predistortion can be enhanced. In addition, since the level of the digital input signal is controlled by the gain control signal and then predistorted, so that the output level of the predistortion digital linearizer can be controlled to a desired level.

32 Claims, 7 Drawing Sheets

PREDISTORTION DIGITAL LINEARIZER AND GAIN CONTROLLING METHOD THEREOF

BACKGROUND OF THE INVENTION

1. Field of the Invention

The present invention relates to a transmitter having a high power amplifier (HPA), and more particularly to a predistortion digital linearizer for the transmitter.

2. Background of the Related Art

A high power amplifier amplifies a radio frequency (RF) signal from a base station of a communication system to the air. The high power amplifier thus can have much influence on the non-linearity of the entire system.

In order to improve the linearity of the HPA, various techniques are used. These techniques include a feed forward method, an envelope feedback method, and a predistortion method.

The predistortion method has been widely adopted as a linearizing method due to the linearizer's low price compared with its performance and its operation characteristic operable in a broader band width.

In the predistortion method, an input signal is initially distorted in a manner opposite to the nonlinear distortion characteristic of the power amplifier. The predistorted signal is then inputted to the high power amplifier, resulting in an output signal having improved linearity.

Figure 1:
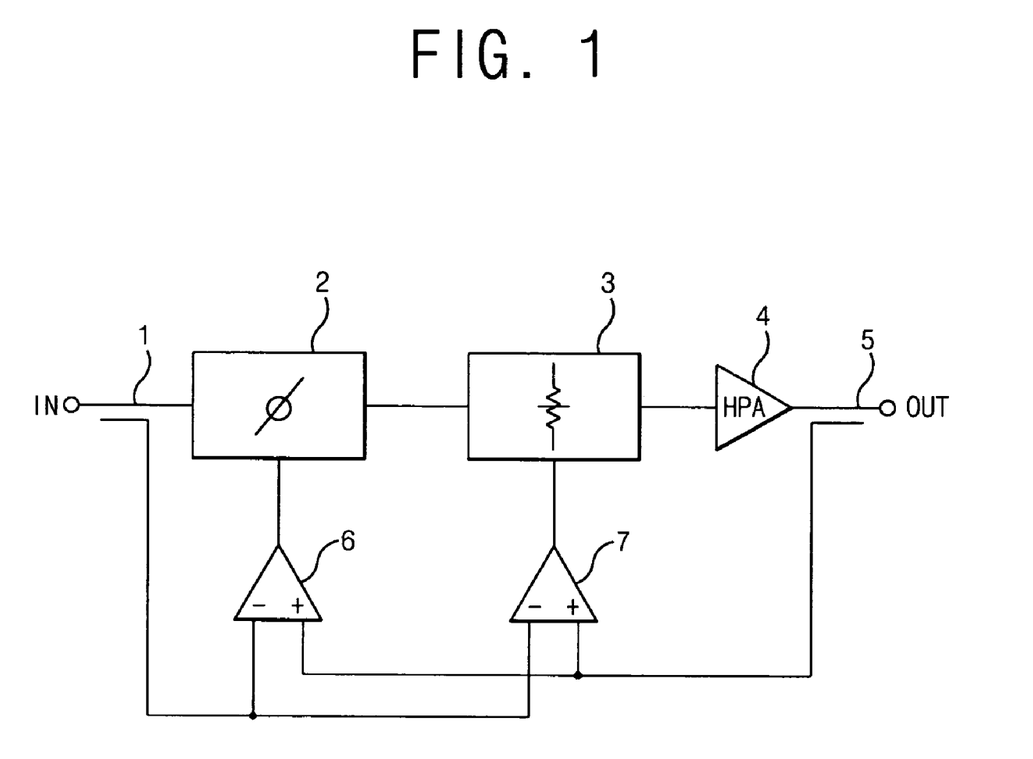
FIG. 1 is a drawing illustrating the construction of a related art predistortion analog linearizer.

FIG. 1 is a schematic view showing the construction of a related art predistortion linearizer in an analog form. As shown in FIG. 1, the predistortion linearizer includes a first directional coupler 1 detecting a sampling signal from an input signal and a phase shifter 2 shifting a phase of the input signal outputted from the first directional coupler 1. It further includes a variable attenuator 3 varying the magnitude of the input signal outputted from the phase shifter 2, a high power amplifier (HPA) 4 amplifying the power of the input signal outputted from the variable attenuator 3, and a second directional coupler 5 for sampling a signal for comparing the input signal from the output of the HPA 4. Comparators 6 and 7 are also provided for comparing the signals respectively outputted from the first and the second directional couplers 1 and 5 and controlling the phase shifter 2 and the variable attenuator 3 by using the comparison resulting value.

The operation of the related art analog type predistortion linearizer of FIG. 1 will now be described.

The first directional coupler 1 samples an input signal and the second directional coupler 5 samples an output signal of the HPA 4. At this time, a sampling ratio should be adjusted so that the two sampling signals have the same magnitude. Since the output signal of the HPA 4 is a power-amplified signal, it should be sampled to fit the magnitude of the input signal.

The sampled signals are inputted to each comparator 6, 7 by the first and the second directional couplers 1 and 5.

The comparators 6 and 7 compare the two inputted signals to obtain a signal difference, that is, an error value. The comparators control the phase shifter 2 and the variable attenuator 2 with the obtained error value, thereby performing predistortion for the input signal of the HPA 4.

However, the related analog type predistortion linearizer has various problems.

For example, since it is susceptible to a temperature change and influenced by noise, the accuracy of the predistortion is degraded.

In addition, since circuits for distorting the input signal should be controlled every time a signal is inputted, it cannot handle an input signal with a broader bandwidth, such as those used in the IMT-2000 (International Mobile Telecommunications-2000).

A gain-based perdistortor has previously been proposed to solve such defect. Such a predistorter, however, is actually implemented with an analog circuit, so that a circuit for adjusting a substantially obtained predistortion control value is relatively complicate compared with the digital method. Thus, supplementary circuits such as a temperature compensation circuit are additionally required.

The above references are incorporated by reference herein where appropriate for appropriate teachings of additional or alternative detail, features and/or technical background.

SUMMARY OF THE INVENTION

An object of the invention is to solve at least the above problems and/or disadvantages and to provide at least the advantages described hereinafter.

Another object of the present invention is to provide a predistortion linearizer that is capable of minimizing an influence of temperature and noise on the circuit.

Another object of the present invention is to provide a predistortion linearizer that improves the accuracy of predistortion linearization by implementing a predistortion circuit and a predistortion control circuit as digital circuits.

Another object of the present invention is to provide a predistortion digital linearizer that can achieve a desired linearized output level of a transmitter by controlling the level of a digital input signal to be linearized by predistortion, and its gain controlling method.

Another object of the present invention is to provide a predistortion digital linearizer, including a predistorter coupled to receive input signal and a control signal to generate a predistorted signal, an up-converter coupled to receive the predistorted signal and convert it into a radio frequency signal, a high power amplifier (HPA) to receive and amplify the radio frequency signal outputted from the up-converter; a feedback unit coupled to receive an output of the HPA and down-convert the received signal into a baseband signal, and an adaptation processing unit coupled to receive the basehand signal and a delayed digital input signal to generate the control signal.

Another object of the present invention is to provide a predistortion digital linearizer, including a digital predistorter to distort a digital input signal according to a control signal, a digital-to-analog converter coupled to convert an output signal of the digital predistorter to an analog signal, a modulator coupled to modulate an output signal of the digital-to-analog converter to a frequency of a carrier, a high power amplifier (HPA) coupled to power-amplify an output signal of the modulator, a demodulator coupled to receive an output signal of the HPA and demodulate it to a baseband signal, an analog-to-digital converter coupled to convert the analog baseband signal outputted from the demodulator to a digital signal, and a digital signal processor coupled to compare an output signal of the analog-to-digital converter to the digital input signal and generate the control signal to control a distortion degree of the digital predistorter.

Another object of the present invention is to provide a predistortion digital linearizer, including a gain control circuit to receive and control a level of a digital input signal according to a gain control signal, a predistorter coupled to predistort the gain controlled digital input signal in accordance with a control signal, a digital-analog converter coupled to convert the predistorted digital signal to an analog signal, a modulator coupled to modulate the analog signal outputted from the digital-analog converter, a high power amplifier (HPA) coupled to power-amplify an output of the modulator, a demodulator coupled to demodulate the amplified signal outputted from the HPA, an analog-digital converter coupled to convert an analog baseband signal outputted from the demodulator to a digital signal, a delay circuit coupled to delay the digital input signal for a prescribed period of time, and a digital signal processor coupled to receive the output signal of the analog-digital converter and an output of the delay circuit to generate the gain control signal and the control signal.

Another object of the present invention is to provide a method for controlling a gain of a predistortion digital linearizer, including determining an output level of a high power amplifier using a feedback digital output signal, computing a gain control signal for gain control by using the determined output level, a desired output level, and a level of a digital input signal delayed for a prescribed period of time, multiplying the current digital input signal by the gain control signal to control the level of the digital input signal, and maintaining a sign bit of the multiplication resulting value, taking the remaining lower bits as a predetermined number of bits, and adjusting the digits of the signals before and after multiplication.

Another object of the present invention is to provide a predistortion linearizer, including a digital predistorter coupled to receive first and second digital input signals and a control signal to generate first and second digital conditioned signals having a prescribed distortion characteristic, an amplifier circuit coupled to receive the first and second digital conditioned signals, convert the digital signals to analog signals, modulate the analog signals, and amplify the modulated signal, and a feedback circuit coupled to receive a portion of the amplified signal and delayed first and second digital input signal signals to generate the digital control signal, wherein the prescribed distortion characteristic is an inverse of a distortion characteristic the amplifier circuit.

To achieve at least the above objects in whole or in parts, there is provided a predistortion digital linearizer including a predistorter distorting a digital input signal to have an opposite characteristic to a nonlinear distortion characteristic of a high power amplifier (HPA); an tip-converter for up-converting the output signal of the predistorter into a radio frequency signal; the HPA for power-amplifying the radio frequency signal outputted from the up-converter; a feedback unit for feeding back the signal outputted from the HPA and down-converting the feedback signal into a baseband signal; and an adaptation processing unit for controlling predistorting of the digital input signal by using the base band signal outputted from the feedback unit and the digital input signal which has been delayed for a predetermined time.

To achieve at least these advantages in whole or in parts, there is further provided predistortion digital linearizer including a gain control circuit controlling a level of the digital input signal according to a gain control signal, a predistorter distorting the digital input signal of which gain has been controlled by the gain control circuit, to have the opposite characteristic to the nonlinear distortion characteristic of a HPA under the control of the digital signal processor; digital-analog converter converting the digital signal outputted from the predistorter to an analog signal; a modulator modulating the baseband analog signal outputted from the digital-analog converter, the HPA for power-amplifying an output of the modulator; a demodulator demodulating the amplified radio frequency signal outputted from the HPA; an analog-digital converter converting an analog baseband signal outputted from the demodulator to a digital signal; a delay delaying the digital input signal for a predetermined time; and a digital signal processor determining an output level of the HPA by using the digital output signal converted by the analog-to-digital converter, and adaptively controlling the gain control and predistortion of the digital input signal by using the determined output level, the signal delayed by the delay unit and a desired output level.

To achieve at least these advantages in whole or in parts, there is further provided a gain control method of a predistortion digital linearizer including determining an output level of a high power amplifier by using a feedback digital output signal; computing a gain control signal for gain control by using the determined output level, a desired output level and a level of digital input signal delayed for a predetermined time; multiplying the current digital input signal by the gain control signal and controlling the level of the digital input signal; and maintaining a sine bit among the multiplication resulting value, and taking the remaining lower bits as the predetermined number of bits to adjust the digits of the signals before and after multiplication.

To achieve at least these advantages in whole or in parts, there is further provided a predistortion linearizer, including a digital predistorter coupled to receive first and second digital input signals and a control signal to generate first and second digital conditioned signals having a prescribed distortion characteristic, an amplifier circuit coupled to receive the first and second digital conditioned signals, convert the digital signals to analog signals, modulate the analog signals, and amplify the modulated signal, and a feedback circuit coupled to receive a portion of the amplified signal and delayed first and second digital input signal signals to generate the digital control signal, wherein the prescribed distortion characteristic is an inverse of a distortion characteristic the amplifier circuit.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 2:
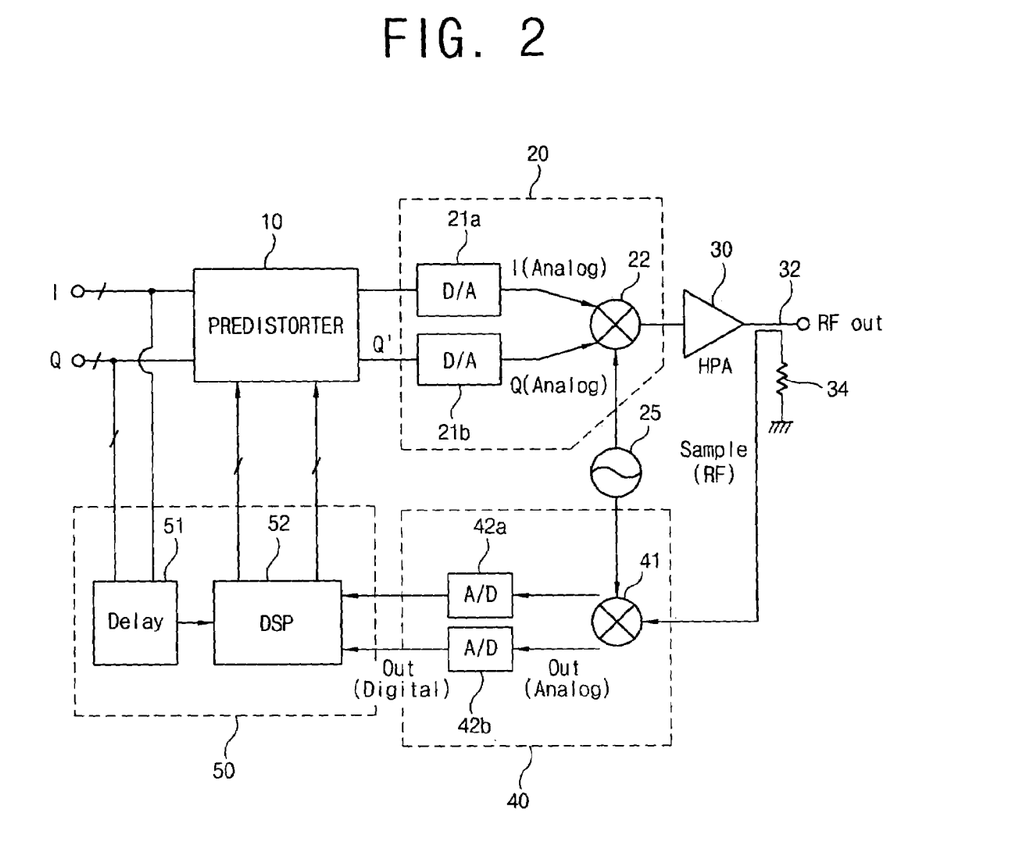
FIG. 2 is drawing illustrating the construction of predistortion digital linearizer in accordance with a first embodiment of the present invention.

FIG. 2 is drawing illustrating the construction or a predistortion digital linearizer in accordance with a first embodiment of the present invention. As shown in FIG. 2, a predistortion digital linearizer (PDL) preferably includes a predistorter 10 to distort a digital input signal so that the digital input signal has a distortion characteristic opposite to a nonlinear distortion characteristic of a high power amplifier (HPA) 30. The PDL further includes an up-converter 20 to up-convert the output signal of the predistorter 10 into a radio frequency (RF) signal, a HPA 30 for power-amplifying the RF signal outputted from the up-converter 20. Next, a feedback unit 40 is provided for feeding back the signal outputted from the HPA 30 and down-converting it. An adaptation processing unit 50 is also provided for controlling predistorting of the digital input signal by using a baseband signal outputted from the feedback unit 40 and the digital input signal which has been delayed for a predetermined time.

The predistortion digital linearizer further preferably includes a local oscillator 25 to provide a local frequency for modulation and demodulation to the up-converter 20 and the feedback, unit 40, and a directional coupler 32 to split the output of the HPA 30 in a certain ratio. A terminator 34 is also provided to terminate the end of a transmission line so that the output signal of the HPA 30, which has passed the directional coupler 32, will not be reflected. The terminator 34 may preferably have a 50Ω resistance component.

The up-converter 20 preferably includes digital-to-analog converters (DAC) 21a and 21b to convert the digital signal outputted from the predistorter 10 to an analog signal. It further includes a modulator 22 to modulate a baseband signal outputted from the digital-to-analog converters 21a and 21b by using the local frequency outputted from the local oscillator 25.

The feedback unit 40 preferably includes a demodulator 41 to demodulate the RF signal outputted from the directional coupler 32 by using the local frequency outputted from the local oscillator 25, and analog-to-digital converters (ADC) 42a and 42b to convert an analog baseband signal outputted from the demodulator 41 to a digital signal.

The adaptation processing unit 50 preferably includes a delay unit 51 to delay the digital input signal for a prescribed period of time, and a digital signal processor (DSP) 52 to control the predistorter 10 by using the signal delayed by the delay unit 51 and the signal outputted from the analog-to-digital converters 42a and 42b of the feedback unit 40.

Figure 3:
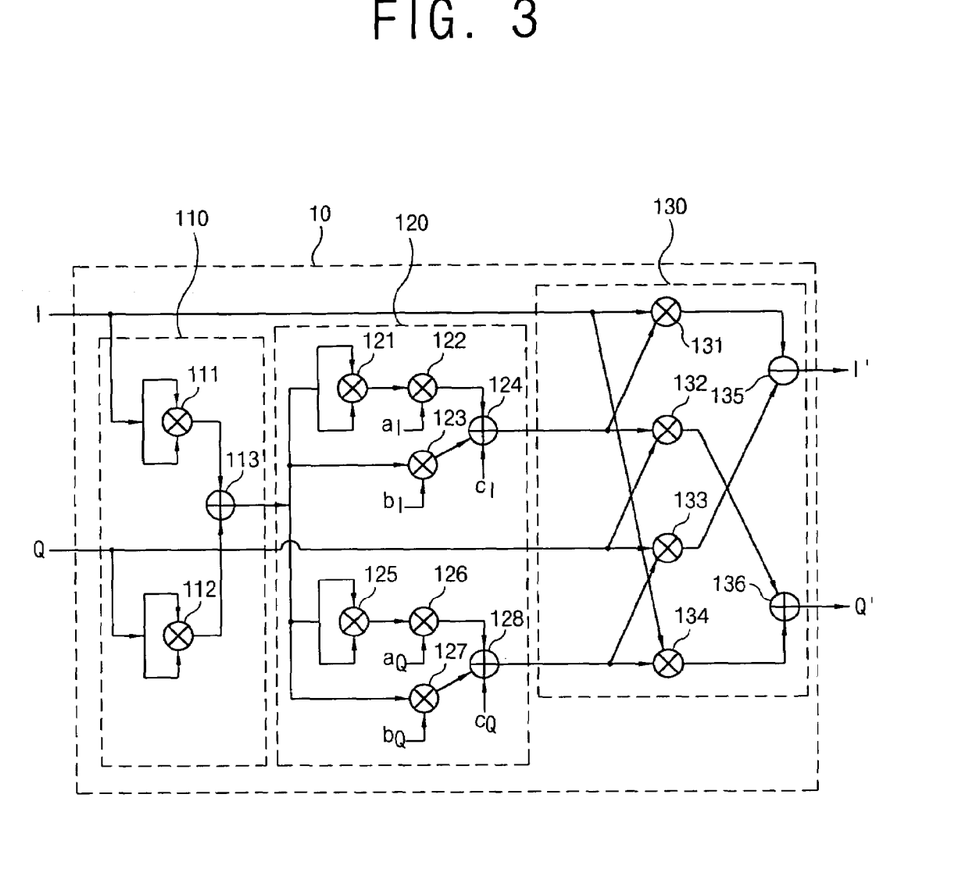
FIG. 3 is a drawing illustrating an internal construction of predistorter of FIG. 2 in accordance with the first embodiment of the present invention.

FIG. 3 shows additional detail of the predistorter 10. As shown in FIG. 3, the predistorter 10 preferably includes a power measuring unit 110 to measure the magnitude of an input signal, and a work function generator 120 to generate a predistortion work function for determining a distortion size of the input signal depending on the magnitude of the input signal. The predistorter 10 further includes a complex coupler 130 for complex-coupling the predistortion work function generated from the work function generator 120 and the input signal to predistort the input signal.

The power measuring unit 110 preferably includes a first square unit 111 that squares a first phase digital input signal (signal I(Inphase)) and outputs a square value, and a second square unit 112 that squares a second phase digital input signal (signal Q(Quadrature)) and outputs a square value. An adder 113 is further provided for adding each output of the first square unit 111 and the second square unit 112 and obtaining the magnitude of the whole digital input signal.

The work function generator 120 preferably includes a first square unit 121 that squares the output of the adder 113 and outputs a square value, and a first coefficient multiplier 122 coupled to receive a secondary term coefficient ($a_1$) of a predistortion work function from the digital signal processor 52, for distorting the first phase digital input signal (signal I), and multiply the output of the first square unit 121 with the secondary term coefficient ($a_1$). The work function generator 120 further includes a second coefficient multiplier 123 that is coupled to receive a primary term coefficient ($b_1$) of the predistortion work function from the digital signal processor 52 for distorting the first phase digital input signal (signal I) and multiply the of the adder 113 with the primary coefficient ($b_1$). A first adder 124 is also provided to receive a constant term ($c_1$) of the predistortion work function from the digital signal processor 52 for distorting the first phase digital input signal (signal I), and add the output of the first coefficient multiplier 122, the output of the second coefficient multiplier 123, and the constant term coefficient ($c_1$) to output a predistortion work function for the first phase digital input signal (signal I).

The work function generator 120 also preferably includes a second square unit 125 that squares the output of the adder 113 and outputs a square value, and a third coefficient multiplier 126 that is coupled to receive a secondary term coefficient ($a_Q$) of the predistortion work function for distorting the second phase digital input signal (signal Q) from the digital signal processor 52, and multiply the output of the second square unit 125 with the secondary term coefficient ($a_Q$). The work function generator 120 also includes a fourth coefficient multiplier 127 coupled to receive a primary term coefficient ($b_Q$) of the predistortion work function from the digital signal processor 52 for distorting the second phase digital input signal (signal Q), and multiply the output of the adder 11 with the primary term coefficient ($b_Q$). A second adder 128 is provided for receiving a constant term coefficient ($c_Q$) of the predistortion work function from digital signal processor 52 for distorting the second phase digital input signal (signal Q), adding the outputs of the third and the fourth coefficient multipliers 126 and 127 and the constant term coefficient ($c_Q$), and outputting a work function for the second phase digital input signal (signal Q).

The coefficients of each term of the predistortion work function for the first phase digital input signal and the predistortion work function for the second phase digital input signal are updated by the digital signal processor 52.

The complex coupler 130 preferably includes a first multiplier 131 to multiply the first phase digital input signal (signal I) with the output of the first adder 124, a second multiplier 132 to multiply the output of the first adder 124 with the second phase digital input signal (signal Q), a third multiplier 133 to multiply the second phase digital input signal (signal Q) with the output of the second adder 128, and a fourth multiplier 134 to multiply the first phase digital input signal (signal I) with the output of the second adder 128. The complex coupler 130 further includes a subtracter 135 to subtract the output of the first multiplier 131 from the output of the third multiplier 133 to distort the first phase digital input signal, and an adder 136 to add the output of the second multiplier 132 to the fourth multiplier 134 to distort the second phase digital input signal.

The transmitter, which preferably comprises the digital linearizer constructed as described above, distorts the digital input signal so that is has a characteristic that is opposite of the non-linear distortion characteristic of the HPA 30. This predistorted signal is transmitted to the HPA 30 to improve the linearity of an output of the HPA 30.

The predistorter 10 is preferably implemented as a field programmable gate array (FPGA) to process a signal in a digital form, which is the least influenced by temperature and noise.

When modeled mathematically, the nonlinear phenomenon of the HPA 30 can be expressed by a polynomial expression containing the primary and the secondary components (components for the power of the digital input signal). Likewise, the predistorter improving the non-linear characteristic also can be expressed as a mathematical model containing the primary and the second components.

In other words, a formula of a predistortion work function that determines a distortion size of a digital input signal is made in advance by a system developer as a secondary polynomial expression according to the magnitude of the digital input signal, and then a circuit for generating the secondary polynomial expression is implemented as a digital circuit.

The thusly implemented predistortion work function generating digital circuit is installed in the predistorter 10. Accordingly, the predistorter receives the magnitude of the digital input signal substantially as an input of the digital circuit for generation of the secondary polynomial expression, and distorts the magnitude of the digital input signal (the first phase digital input signal (signal I) and the second phase digital input signal (signal (Q)) through the complex coupler 130.

An operation of the predistortion digital linearizer in accordance with the first embodiment of the present invention constructed as described above will now be described.

The predistorter 10 preferably receives and splits a digital input signal into two paths, and passes the digital input signal through one path. A work function is then generated according to a power by determining the magnitude of the digital input signal (that is, the power) for the other path.

The predistorter 10 then complex-couples the signals of the two paths to generate an input signal distorted opposite to the non-linear characteristic of the HPA 30. The distorted signal is finally output through the up-converter 20 to the HPA 30.

An operation of the predistorter 10 will now be described in more detail. In the power measuring unit 110, the first square unit 111 squares the first phase digital input signal (signal I) to obtain a first square value, and the second square unit 112 squares the second phase digital input signal (signal Q) to obtain a second square value. The adder 113 adds the two square values and thus outputs die magnitude of the digital input signal.

It is assumed that the value obtained by adding the two square values, that is, the output value $(I_2+Q_2)$ of the adder 113 of the power measuring unit 110 is 'X'. The work function generator 120 generates a predistortion work function by using a coefficient of each degree of the predistortion work function provided from the digital signal processor 52 according to the power 'X' measured by the power measuring unit 110.

Specifically, the first adder 124 of the work function generator 120 generates a predistortion work function for the signal I as shown in equation (1) below. The second adder 128 generates a predistortion work function for the signal Q as shown in equation (2) below.

$$a_1 X^2 + b_1 X + c_1 \tag{1}$$

$$a_Q X^2 + b_Q X + c_Q \tag{2}$$

In equation (1), $a_1$ is a secondary term coefficient of the predistortion work function for signal I, $b_1$ is a primary term coefficient of the predistortion work function for signal I, and $c_1$ is a constant term of the predistortion work function for signal I.

In equation (2), $a_Q$ is a secondary term coefficient of the predistortion work function for signal Q, $b_Q$ is a primary coefficient of the predistortion work function for signal Q, and $c_Q$ is a constant term of the predistortion work function for signal Q.

The complex coupler 130 couples the predistortion work function for the signal I outputted from the work function generator 120, the predistortion work function for the signal Q, the original signal I and signal Q, and thus distorts the original signal I and signal Q.

That is, the first multiplier 131 multiplies signal I with the predistortion work function for the signal I and the second multiplier 132 multiplies the predistortion work function for signal I with signal Q. The third multiplier 133 multiplies signal Q with the predistortion work function for signal Q, and the fourth multiplier 134 multiplies signal I with the predistortion work function for signal Q.

Next the subtracter 135 subtracts the output of the first multiplier 131 from the output of the third multiplier 133 to distort signal I in a manner opposite to the non-linear characteristic of the HPA 30. The adder 136 adds the output of the second multiplier 132 to the fourth multiplier 134 to distort signal Q in a manner opposite to the non-linear characteristic of the HPA 30.

The digital output signals I' and Q' are thus predistorted in a manner opposite to the non-linear characteristic of the HPA 30 by the predistorter 10. These signals I' and Q' are then converted to analog signals by D/A converter 21a and 21b, and are modulated by the modulator 22. The modulated signal is finally inputted to the HPA 30.

The HPA 30 power-amplifies the applied RF signal, and the power-amplified signal at this time has a linear characteristic without having the non-linear characteristic.

The directional coupler 32 preferably splits the output of the HPA 30 in a certain prescribed ratio. The demodulator 41 of the feedback unit 40 demodulates the linearized RF signal split by the directional coupler 32. The analog-to-digital converters 42a and 42b convert the analog baseband signal outputted from the demodulator 41 to a digital signal and provide the digital signals to the adaptation processing unit 50.

The adaptation processing unit 50 preferably controls the predistorter 10 by using the output signal of the HPA 30 which has been feedback through the feedback unit 40 and the digital input signal which has been delayed for a prescribed period of time.

That is, the delay unit 51 delays the digital input signals (signal I and signal Q) of the digital linearizer for a predetermined time. The digital signal processor 52 compares the output signal of the delay unit 51 and the signal outputted from the analog-to-digital converters 42a and 42b, updates coefficients of the predistortion work function so that the error can become small, and then provides the updated coefficients to the predistorter 10.

Figure 4:
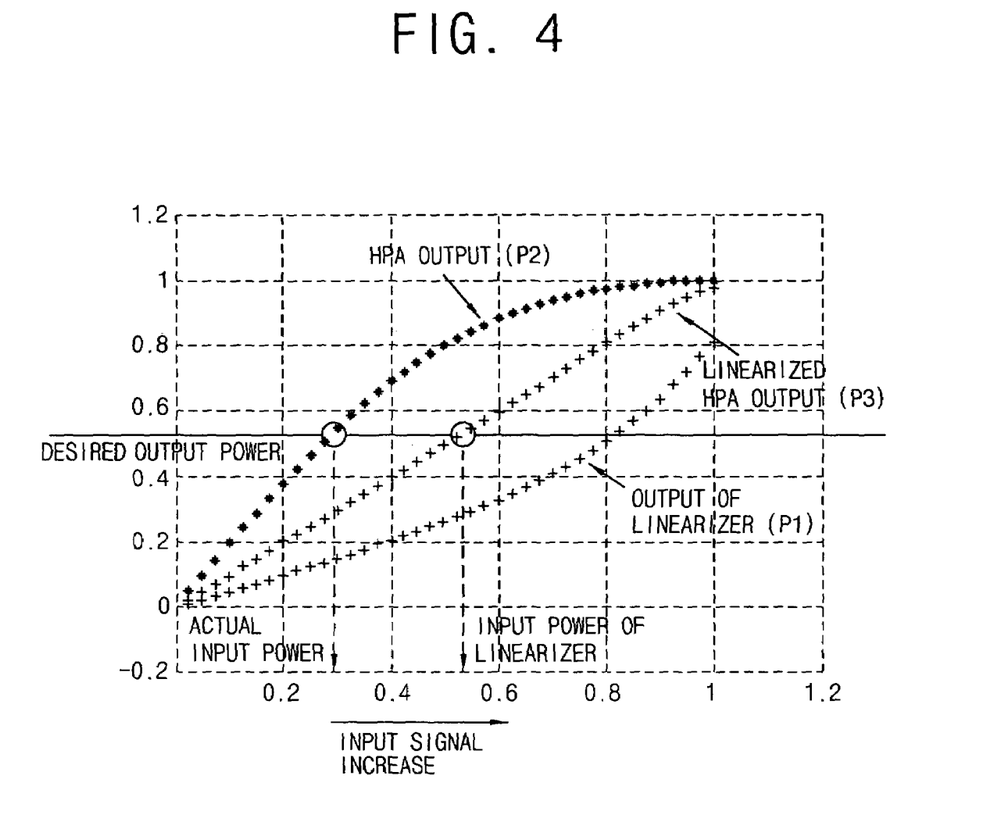
FIG. 4 is a drawing illustrating an input and output characteristic curve and a compensation curve of the predistortion digital linearizer in accordance with the first embodiment of the present invention.

As shown in FIG. 4, when the signal P1 predistorted by the predistorter 10 is inputted to the HPA 30 under the control of the adaptation processing unit 50, the HPA 30 amplifies the input signal with the non-linear characteristic P2, so that a linearized output P3 is finally obtained with the non-linearity improved.

In the predistortion digital linearizer of the first embodiment of the present invention, the predistorter is preferably constructed as a digital circuit (i.e., the FPGA) to directly process the input signal of the digital linearizer in the digital domain. In this way temperature and noise influences can be minimized, and the accuracy of the predistortion circuit can be improved.

Additionally, when the predistorter and the adaptation processing unit receive the digital signal, they process the signal in the digital domain. Consequently, the design is simplified and a signal can be precisely manipulated.

Figure 5:
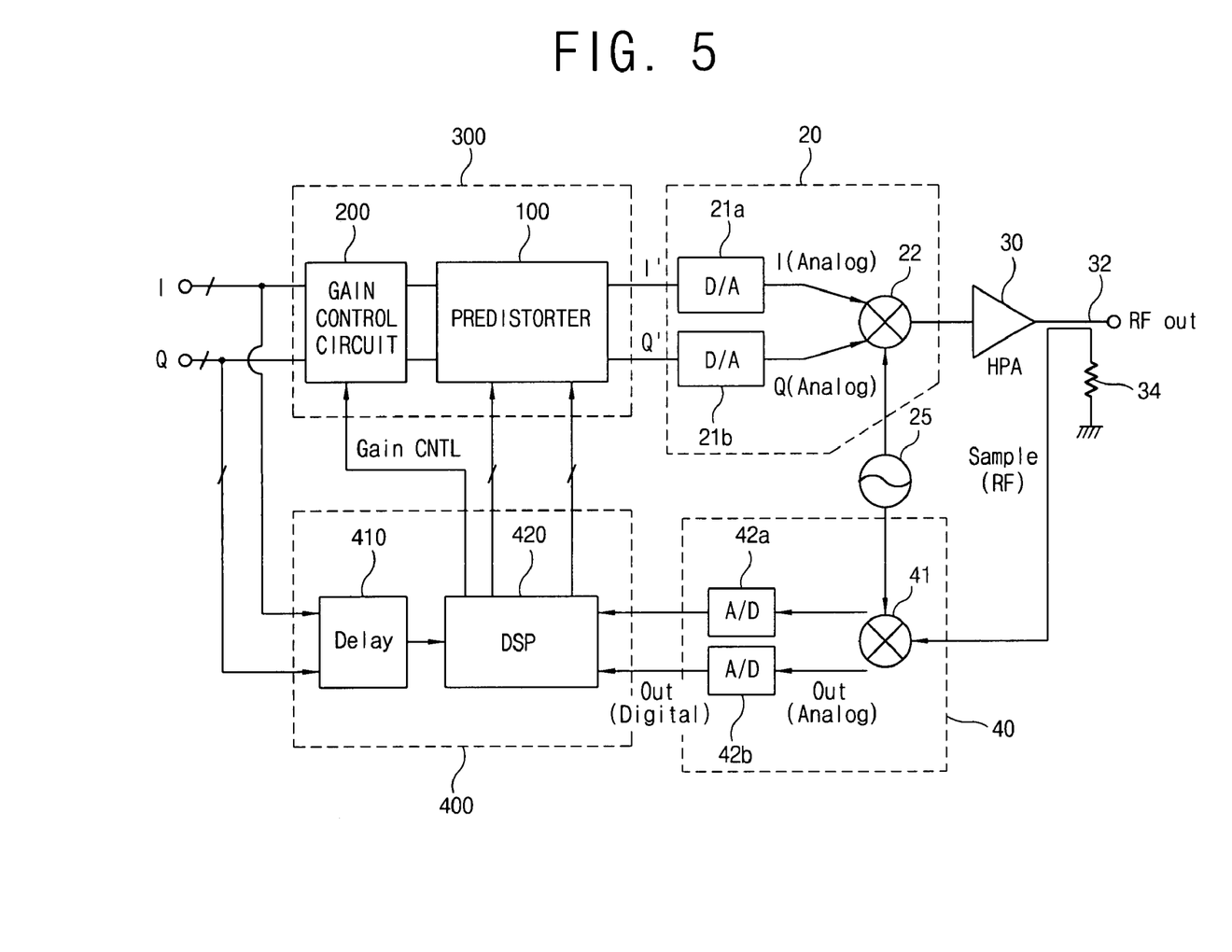
FIG. 5 is a drawing illustrating a predistortion digital linearizer in accordance with a second embodiment of the present invention.

FIG. 5 is a drawing illustrating a predistortion digital linearizer in accordance with a second embodiment of the present invention. There is a range of an output level of the transmitter, that is, the digital linearizer, that is typically used by a mobile communication system such as the IMT-2000. If the output level of the digital linearizer goes beyond the requested range, the output level of the digital linearizer should be adjusted.

As shown in FIG. 5, a predistortion digital linearizer in accordance with the second embodiment of the present invention includes a gain control predistortion unit 300 to control a level of a digital input signal and distort the level-controlled digital input signal to have characteristics opposite to the non-linear distortion characteristic of the HPA 30. It further includes an up-converter 20 for up-converting the output signal of the gain control predistortion unit 300 into a radio frequency (RF) signal, a HPA 30 for power-amplifying an RF signal outputted from the up-converter 20, and a feedback unit 40 for feeding back the signal outputted from the HPA 30 and down-converting it. An adaptation processing unit 400 is further provided to adaptively controlling the gain control and the predistortion of the input signal of the HPA 30.

The predistortion digital linearizer of the second embodiment also includes a local oscillator 25, a directional coupler 32, and a terminator 34 as in the first embodiment.

The gain control predistortion unit 300 preferably includes a gain control circuit 200 to control the level of the digital input signal in accordance with a gain control signal outputted from the adaptation processing unit 400, and a predistorter 100 to distort the digital input signal that has been gain-controlled by the gain control circuit 200 to compensate for the non-linear distortion characteristic of the HPA 30. The predistorter HPA 30 has the same construction as that of the predistorter 10 of the first embodiment, and will thus not be described in detail.

Figure 6:
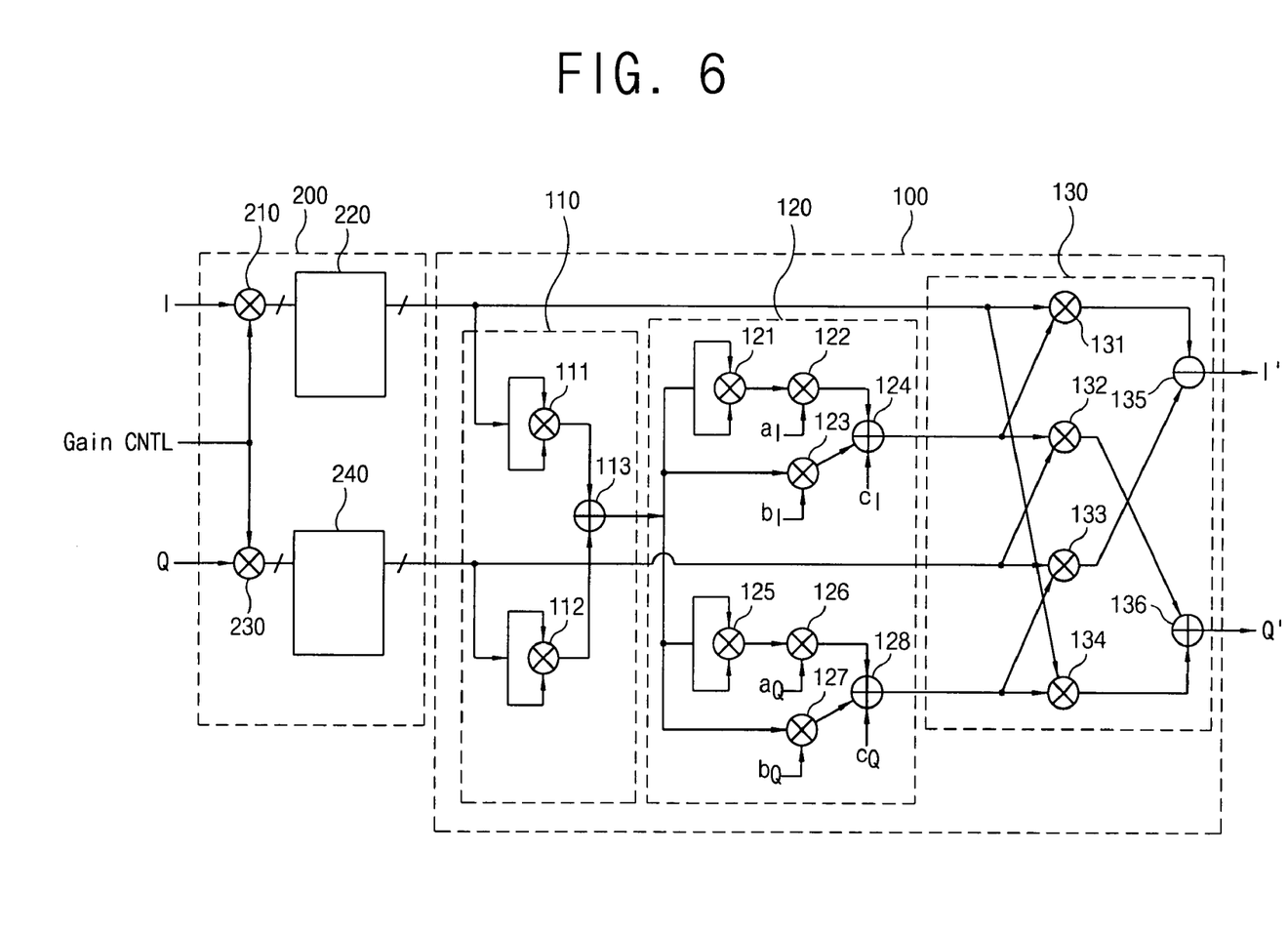
FIG. 6 is a drawing illustrating an internal construction of a gain control circuit and a predistorter of FIG. 5 in accordance with the second embodiment of the present invention.

Referring to FIG. 6 the gain control circuit 200 preferably includes a first multiplier 210 that multiplies the first phase digital input signal (signal I) with the gain control signal to control the level of the first phase digital input signal and a first rounding unit 220 that takes a predetermined number of bits from the digital output signal of the first multiplier 210, and adjusts an input and output digit. The gain control circuit also includes a second multiplier 230 that multiplies the second phase digital input signal (signal Q) with the gain control signal to control the level of the second phase digital input signal, and a second rounding unit 240 that takes a predetermined number of bits from the digital output signal of the second multiplier 230, and adjusts an input and output digit.

The gain control signal is a signal to control the level of an original digital input signal before predistortion. It is set according to the level of a delayed digital input signal, an output level of the HPA estimated by using the feedback digital output signal, and a desired output level of the HPA. Accordingly, the gain control signal controls the level of the digital input signal to obtain a desired level of the output of the HPA.

The adaptation processing unit 400 preferably includes a delay unit 410 to delay the digital input signal of the digital linearizer for a predetermined time, and a digital signal processor (DSP) 420 to determine the output level of the HPA 30 in accordance with the digital output signal converted from the analog-to-digital converters 42a and 42b. The DSP 420 also adaptively controls a gain control and a predistortion of the digital input signal in accordance with the determined output level, the signal delayed by the delay unit 410, and the desired output level.

Accordingly, as shown in FIG. 5, the gain control signal provided to the gain control circuit 200 may be generated by the digital signal processor 420 or may be provided from an external source.

The up-converter 20 and the feedback unit 40 have the same construction as the up-converter 20 and the feedback unit 40 of the first embodiment. Descriptions of these elements are thus omitted.

An operation of the predistortion digital linearizer in accordance with the second embodiment of the present invention constructed as described above will now be described.

If an output level of the digital linearizer does not reach a requested range, a gain control signal for raising the output level of the digital linearizer is provided to the gain control circuit 200. Alternatively, if the output level of the digital linearizer exceeds the requested range, a gain control signal for lowering the output level of the digital linearizer is provided to the gain control circuit 200.

The linearization algorithm is preferably performed by regarding the greatest digital signal as '1'. Thus, since the highest bit of a 14 bit signal is regarded as '1', there is a limitation to raise the level of the digital input signal.

Accordingly, the predistorter is designed such that the bit number of coefficients of each degree of the predistortion work function is 20 bits, so that the level of the input signal can be accurately adjusted.

Thus, a shown in FIG. 4, if the output level of the predistortion digital linearizer (the transmitter) is lower than a desired level, an input signal with its level increased should be applied to the transmitter so that an output level of the transmitter can reach the desired level.

Figure 7:
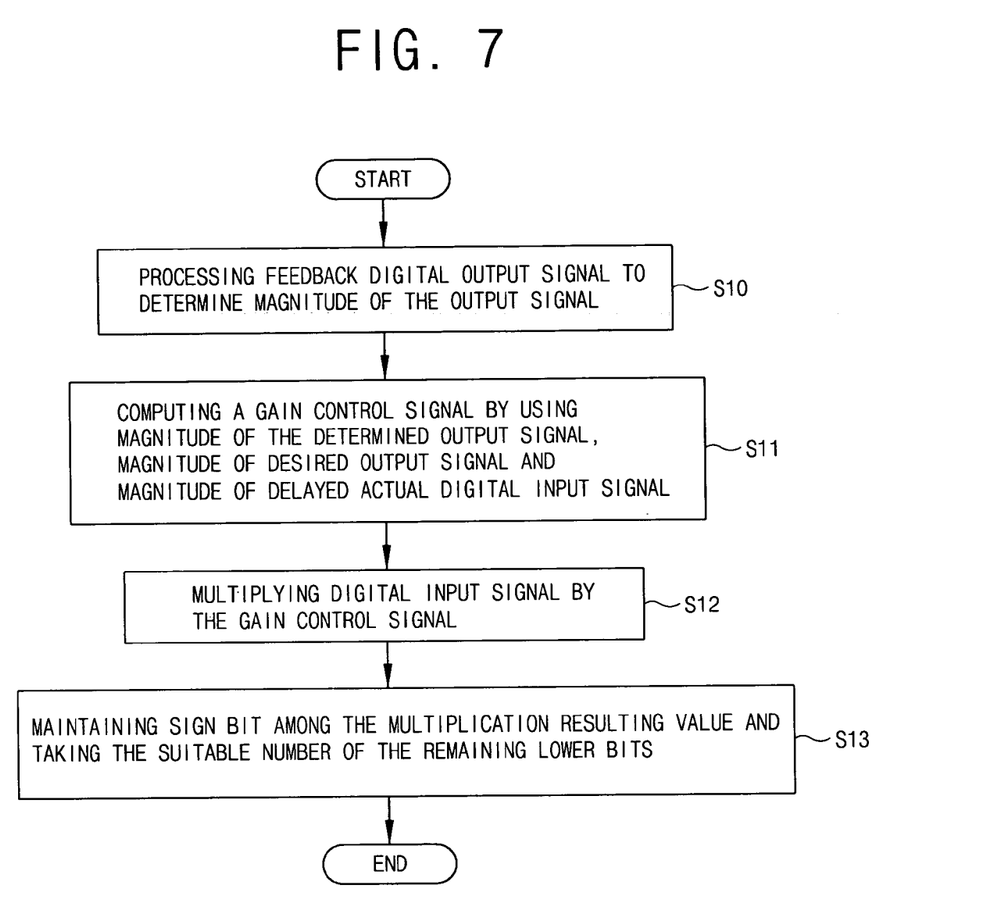
FIG. 7 is a flow chart of a method for controlling a gain of a digital input signal of the predistortion digital linearizer in accordance with a preferred embodiment of the present invention.

A method for controlling a gain of the digital input signal of the predistortion digital linearizer will now be described with reference to FIG. 7. Referring to FIG. 7, the feedback unit 40 feeds back the analog output signal of the HPA 30, converts it to a digital output signal and outputs it to the DSP 420 of the adaptation processing unit 400. The delay unit 410 delays the digital input signals (I, Q) of the digital linearizer for a predetermined time and provides the delayed signals to the DSP 420.

The DSP 420 then processes the digital output signal from the feedback unit 40 and determines the output level of the HPA (step S10).

Next, the DSP 420 computes a gain control signal for controlling the gain. This signal is calculated on the basis of input and output characteristics of the curved line shown in FIG. 4 by using the level of the digital input signal delayed in the delay unit 410, the determined output level and a desired output level (step S11). It should be noted that the gain control signal could be calculated and provided by an element other than the DSP 420.

If the output level of the HPA is lower than the desired level, the DSP 420 generates a gain control signal to increase the level of the digital input signal (here, the gain control signal is generated by the DSP 420, it may be also provided from an external source).

The gain control circuit 200 then multiplies the gain control signal with each of the digital input signals (signal I and signal Q). Specifically, the first multiplier 210 multiplies the gain control signal and signal I and the second multiplier 230 multiplies the gain control signal and signal Q, thereby controlling the gain (step S12).

At this time, the bit number of each output value of the first multiplier 210 and the second multiplier 230 becomes different from the bit number before the multiplication. Thus, the first and the second rounding units 220 and 240 maintain a sign bit among each output value of the first and the second multipliers 210 and 230 and take a suitable number of remaining lower bits to adjust the digits and synchronization (S13).

The level-adjusted signals I and Q from the gain control circuit 200 are next inputted to the predistorter 100. Then, the predistorter 100 measures the power of the level-adjusted signals I and Q, and generates predistortion work functions for the signal I and the signal Q using coefficients of each degree of the predistortion work function provided from the digital signal processor 420 according to the measured power.

The predistorter 100 then complex-couples the level-adjusted signals I and Q and the predistortion work function, and thus distorts the signal I and the signal Q to counter the non-linear distortion characteristic of the HPA 30. It is preferable that the predistortion of the signals I and Q be opposite of the non-linear distortion of the HPA 30.

After the level is controlled, the predistorted digital input signal is inputted through the up-converter 20 to the HPA 30, and the follow-up operation is performed in the same manner as that of the first embodiment, descriptions of which are thus omitted.

Accordingly, since the level of the digital input signal of the digital linearizer is controlled in accordance with the gain control signal, and since the level-adjusted digital input signal is then predistorted, the output level of the digital linearizer counters the non-linear characteristics of the HPA, so that an output of the HPA 30 can be controlled by the predistortion method. It should be noted that the above described method is applicable to both the first and second embodiments.

The predistortion digital linearizer and its gain controlling method have many advantages. For example, since the input signal of the digital linearizer is directly predistorted in the digital domain the accuracy of the predistortion can be enhanced.

Next, the level of the digital input signal is controlled by the gain control signal and then predistorted, so that the output level of the predistortion digital linearizer can be controlled to a desired level.

Further, when the gain control circuit, the predistorter, and the adaptation processing unit receive a digital signal, they perform signal processing in the digital domain. Consequently, the influences of temperature and noise can be minimized. Also, the design is simplified and a signal can be mote precisely manipulated.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A predistortion digital linearizer, comprising:
    a predistorter coupled to receive an input signal and a control signal to generate a predistorted signal;
    an up-converter coupled to receive the predistorted signal and convert the predistorted signal into a radio frequency signal;
    a high power amplifier (HPA) to receive and amplify the radio frequency signal outputted from the up-converter;
    a feedback unit coupled to receive an output of the HPA and down-convert the received output of the HPA into a baseband signal;
    an adaptation processing unit coupled to receive the baseband signal and a delayed digital input signal to generate the control signal, the adaptation processing unit including:
        a delay unit to delay the input signal for a prescribed period of time; and
        a digital signal processor coupled to receive the delayed input signal from the delay unit and the baseband signal from the feedback unit to generate the control signal, wherein the predistorter comprises:
        a power measuring unit to measure a power magnitude of the input signal;
        a work function generator to receive an output of the power measuring unit and the control signal and to generate a predistortion work function for determining a distortion size of the input signal according to the magnitude of the input signal; and
        a complex coupler to receive and complex-couple the predistortion work function and the input signal to generate the predistorted signal.

2. The predistortion digital linearizer of claim 1, wherein the power measuring unit comprises:
    a first square unit to square a first phase digital input signal and output a first square value;
    a second square unit to square a second phase digital input signal and output a second square value; and
    an adder configured to add the first square value and the second square value to obtain the magnitude of the input signal.

3. The predistortion digital linearizer of claim 1, wherein the work function generator comprises:
    a first square unit to square the power magnitude measured by the power measuring unit to generate a first square value;
    a first coefficient multiplier to multiply the first square value with a first coefficient value outputted from the adaptation processing unit;
    a second coefficient multiplier to multiply the power magnitude measured by the power measuring unit with a second coefficient value outputted from the adaptation processing unit;

a first adder to add outputs of the first and the second coefficient multipliers and a third coefficient value outputted from the adaptation processing unit to form a first predistortion work function;

a second square unit to square the power magnitude measured by the power measuring unit to generate a second square value;

a third coefficient multiplier to multiply the second square value with a fourth coefficient value outputted from the adaptation processing unit;

a fourth coefficient multiplier to multiply the power magnitude measured by the power measuring unit with a fifth coefficient value outputted from the adaptation processing unit; and a second adder to add the outputs of the third and the fourth coefficient multipliers and a sixth coefficient value outputted from the adaptation processing unit to form a second predistortion work function.

4. The predistortion digital linearizer of claim 3, wherein the first predistortion work function corresponds to a first phase of the input signal, and wherein the second predistortion work function corresponds to a second phase of the input signal.

5. The predistortion digital linearizer of claim 1, wherein the complex coupler comprises:
a first multiplier to multiply a first phase digital input signal with a first work function;
a second multiplier to multiply a second phase digital input signal with the first work function;
a third multiplier to multiply the second phase digital input signal with a second work function;
a fourth multiplier to multiply the first phase digital input signal with the second work function;
a subtracter to subtract an output of the first multiplier from an output of the third multiplier to distort the first phase digital input signal; and
an adder to add an output of the second multiplier to an output of the fourth multiplier to distort the second phase digital input signal.

6. A predistortion digital linearizer, comprising:
a predistorter coupled to receive an input signal and a control signal to generate a predistorted signal;
an up-converter coupled to receive the predistorted signal and convert the predistorted signal into a radio frequency signal;
a high power amplifier (HPA) to receive and amplify the radio frequency signal outputted from the up-converter;
a feedback unit coupled to receive an output of the HPA and down-convert the received output of the HPA into a baseband signal;
an adaptation processing unit coupled to receive the baseband signal and a delayed digital input signal to generate the control signal;
a local oscillator to generate a local frequency for modulation and demodulation at the up-converter and the feedback unit;
a directional coupler configured to split the output of the HPA in a prescribed ratio; and
a terminator to terminate an end of a transmission line to prevent reflection of the output of the HPA that has passed the directional coupler.

7. The predistortion digital linearizer of claim 1, wherein the input signal is a digital input signal and the predistorted signal is a predistorted digital signal, and wherein the up-converter comprises:
first and second digital-to-analog converters to convert the predistorted digital signal to an analog signal; and
a modulator to modulate the analog signal outputted from the digital-to-analog converters.

8. The predistortion digital linearizer of claim 1, wherein the feedback unit comprises:
a demodulator to demodulate the output of the HPA and provide a demodulated analog signal; and
first and second analog-to-digital converters to convert the demodulated analog signal outputted from the demodulator to a digital signal.

9. The predistortion digital linearizer of claim 1, wherein the predistorted digital signal has a distortion characteristic that is opposite of a distortion characteristic of the HPA, such that the output of the HPA is substantially non-distorted.

10. The predistortion digital linearizer of claim 1, wherein each of the input signal, the predistorted signal, and the baseband signal is a digital signal.

11. A predistortion digital linearizer comprising:
a gain control circuit to receive an input signal and control a gain of the input signal according to a gain control signal, and output a gain controlled input signal;
a predistorter to receive the gain controlled input signal and a control signal to generate a predistorted signal;
an up-converter coupled to receive the predistorted signal and convert the predistorted signal into a radio frequency signal;
a high power amplifier (HPA) to receive and amplify the radio frequency signal outputted from the up-converter;
a feedback unit coupled to receive an output of the HPA and down-convert the received output of the HPA into a baseband signal;
an adaptation processing unit coupled to receive the baseband signal and a delayed digital input signal to generate the control signal, the adaptation processing unit including:
a delay unit to delay the input signal for a prescribed period of time, and
a digital signal processor coupled to receive the delayed input signal and the baseband signal from the feedback unit to generate the control signal.

12. The predistortion digital linearizer of claim 11, wherein the gain of the gain control signal is set according to a gain of the delayed input signal, an output level of the HPA estimated by using feedback digital output signal, and a desired HPA output level.

13. The predistortion digital linearizer of claim 11, wherein the gain control signal can be provided by the adaptation processing unit and can be provided by an external source.

14. The predistortion digital linearizer of claim 11, wherein the gain control circuit comprises:
a first multiplier to multiply a first phase digital input signal with the gain control signal to control a level of the first phase digital input signal;
a first rounding unit to remove a prescribed number of bits from a digital output signal of the first multiplier and adjust input and output digits;
a second multiplier to multiply a second phase digital input signal with the gain control signal and control a level of the second phase digital input signal; and
a second rounding unit to remove the prescribed number of bits from a digital output signal of the second multiplier and adjust input and output digits.

15. The predistortion digital linearizer of claim 14, wherein the first and second rounding units maintain a sign bit of corresponding outputs of the first and second multipliers, and remove a prescribed number of lower bits from the corresponding outputs.

16. A predistortion digital linearizer, comprising:
a digital predistorter to distort a digital input signal according to a control signal, the digital input signal comprising first and second digital input signals, the first digital input signal having a different phase than the second digital input signal, and wherein the digital predistorter separately distorts the first and second digital input signals to provide first and second output signals, the digital predistorter including:
  a power measuring unit to measure a power magnitude of the input signal,
  a work function generator configured to receive an output of the power measuring unit and the control signal and configured to generate a predistortion work function for determining a distortion size of the input signal according to the magnitude of the input signal, and
  a complex coupler configured to receive and complex-couple the predistortion work function and the input signal to generate the first and second output signals;
a digital-to-analog converter comprising first and second digital-to-analog converters to convert the first and second output signals of the digital predistorter to analog signals;
a modulator coupled to modulate an output signal of the digital-to-analog converter to a frequency of a carrier;
a high power amplifier (HPA) coupled to power-amplify an output signal of the modulator;
a demodulator coupled to receive an output signal of the HPA and demodulate the output signal of the HPA to a baseband signal;
an analog-to-digital converter coupled to convert the baseband signal outputted from the demodulator to a digital signal, the analog-to-digital converter comprising first and second analog-to-digital converters to convert first and second analog baseband signals to first and second digital feedback signals; and
a digital signal processor coupled to compare an output signal of the analog-to-digital converter to the digital input signal and generate the control signal to control a distortion degree of the digital predistorter, wherein the digital signal processor uses each of the first and second digital feedback signals to generate the control signal.

17. The predistortion digital linearizer of claim 16, wherein the predistorted digital signal has a distortion characteristic that is opposite of a distortion characteristic of the HPA, such that an output signal of the HPA is substantially non-distorted.

18. The predistortion digital linearizer of claim 16, further comprising a coupler to receive and split off a portion of the output signal of the HPA and provide the split off portion to the demodulator.

19. The predistortion digital linearizer of claim 16, wherein the digital signal processor generates first and second control signals to control each of the first and second digital input signals separately.

20. A predistortion digital linearizer, comprising:
a gain control circuit to receive and control a level of a digital input signal according to a gain control signal;
a predistorter coupled to predistort the gain controlled digital input signal in accordance with a control signal;
a digital-analog converter coupled to convert the predistorted digital signal to an analog signal;
a modulator coupled to modulate the analog signal outputted from the digital-analog converter;
a high power amplifier (HPA) coupled to power-amplify an output of the modulator;
a demodulator coupled to demodulate the amplified signal outputted from the HPA;
an analog-digital converter coupled to convert an analog baseband signal outputted from the demodulator to a digital signal;
a delay circuit coupled to delay the digital input signal for a prescribed period of time; and
a digital signal processor coupled to receive an output signal of the analog-digital converter and an output of the delay circuit to generate the gain control signal and the control signal.

21. The predistortion digital linearizer of claim 20, wherein the gain control circuit comprises:
a first multiplier to multiply a first phase digital input signal with the gain control signal to control a level of the first phase digital input signal;
a first rounding unit to take a prescribed number of bits from a digital output signal of the first multiplier and adjust input and output digits;
a second multiplier to multiply a second phase digital input signal with the gain control signal and control a level of the second phase digital input signal; and
a second rounding unit to take the prescribed number of bits from a digital output signal of the second multiplier and adjust input and output digits.

22. The predistortion digital linearizer of claim 20, wherein the predistorter comprises:
a first squaring unit to output a square value of a first phase digital input signal;
a second squaring unit to output a square value of a second phase digital input signal;
a first adder to add outputs of the first and the second square units to obtain a power of the digital input signal;
a third squaring unit to output a square value of an output of the first adder;
a first coefficient multiplier to multiply an output of the third square unit with a first coefficient value from the digital signal processor;
a second coefficient multiplier to multiply the output of the first adder with a second coefficient value from the digital signal processor;
a second adder to add outputs of the first and the second coefficient multipliers and a third coefficient value from the digital signal processor to output a first predistortion work function;
a fourth squaring unit to output a square value of the output of the first adder;
a third coefficient multiplier to multiply an output of the fourth square unit with a fourth coefficient value from the digital signal processor;
a fourth coefficient multiplier to multiply the output of the first adder and a fifth coefficient value from the digital signal processor;
a third adder to add outputs of the third and the fourth coefficient multipliers and a sixth coefficient value from the digital signal processor to output a second predistortion work function;
a first multiplier to multiply the first phase digital input signal and the first predistortion work function;
a second multiplier to multiply the second phase digital input signal and the first predistortion work function;
a third multiplier to multiply the second phase digital input signal and the second predistortion work function;
a fourth multiplier to multiply the first phase digital input signal and the second predistortion work function;

a subtracter to subtract an output of the first multiplier from an output of the third multiplier to distort the first phase digital input signal; and a fourth adder to add an output of the second multiplier and an output of the fourth multiplier to distort the second phase digital input signal.

23. The predistortion digital linearizer of claim 20, wherein the digital signal processor is configured to adaptively control a gain and predistortion of the digital input signal according to an output level of the HPA, a delayed digital input signal, and a desired output level.

24. A predistortion linearizer, comprising:

a gain control circuit to receive first and second digital input signals and control a gain of the first and second digital input signals according to a gain control signal, and output first and second gain controlled digital input signals;

a digital predistorter coupled to receive the first and second gain controlled digital input signals and a digital control signal to generate first and second digital conditioned signals having a prescribed distortion characteristic;

an amplifier circuit coupled to receive the first and second digital conditioned signals, convert the digital conditioned signals to analog signals, modulate the analog signals, and amplify the modulated signal; and a feedback circuit coupled to receive a portion of the amplified signal and delayed first and second digital input signals to generate the digital control signal, wherein the prescribed distortion characteristic is an inverse of a distortion characteristic of the amplifier circuit.

25. The predistortion linearizer of claim 24, wherein the digital predistorter comprises:

a power measuring unit to measure a power magnitude of the first and second digital input signals;

a work function generator configured to receive an output of the power measuring unit and the digital control signal, and configured to generate a predistortion work function to determine a distortion size of the digital input signals according to a magnitude of the digital input signals; and a complex coupler configured to receive and complex-couple the predistortion work function and the digital input signals to generate the first and second digital conditioned signals.

26. The predistortion linearizer of claim 25, wherein the power measuring unit comprises:

a first square unit to square the first digital input signal and output a first square value;

a second square unit to square the second digital input signal and output a second square value; and an adder configured to add the first and second square values to obtain the magnitude of the digital input signal.

27. The predistortion linearizer of claim 25, wherein the work function generator comprises:

a first square unit to square the power magnitude measured by the power measuring unit to generate a first square value;

a first coefficient multiplier to multiply the first square value with a first coefficient value outputted from the feedback circuit;

a second coefficient multiplier for multiplying the power magnitude measured by the power measuring unit with a second coefficient value outputted from the feedback circuit;

a first adder to add outputs of the first and the second coefficient multipliers and a third coefficient value outputted from the feedback circuit to form a first predistortion work function;

a second square unit to square the power magnitude measured by the power measuring unit to generate a second square value;

a third coefficient multiplier to multiply the second square value with a fourth coefficient value outputted from the feedback circuit;

a fourth coefficient multiplier to multiply the power magnitude measured by the power measuring unit with a fifth coefficient value outputted from the feedback circuit; and a second adder to add the outputs of the third and the fourth coefficient multipliers and a sixth coefficient value outputted from the feedback circuit to form a second predistortion work function.

28. The predistortion linearizer of claim 27, wherein the first predistortion work function corresponds the first digital input signal, and wherein the second predistortion work function corresponds to the second digital input signal.

29. The predistortion linearizer of claim 25, wherein the complex coupler comprises:

a first multiplier to multiply the first digital input signal with a first work function;

a second multiplier to multiply the second digital input signal with the first work function;

a third multiplier to multiply the second phase digital input signal with the second work function;

a fourth multiplier to multiply the first phase digital input signal with the second work function;

a subtracter to subtract an output of the first multiplier from an output of the third multiplier to distort the first phase digital input signal; and an adder to add an output of the second multiplier to an output of the fourth multiplier to distort the second phase digital input signal.

30. The predistortion linearizer of claim 24, further comprising:

a local oscillator to generate a local frequency for modulation and demodulation at an up-converter and the feedback circuit;

a directional coupler configured to split an output of the amplifier circuit in a prescribed ratio; and a terminator to terminate an end of a transmission line to prevent reflection of the output of the amplifier circuit that has passed the directional coupler.

31. The predistortion linearizer of claim 24, wherein the feedback circuit comprises:

a demodulator coupled to receive and demodulate an output of the amplifier circuit;

first and second analog-to-digital converters coupled to convert a demodulated signal outputted from the demodulator into a baseband digital signal; and a digital signal processor coupled to receive the baseband digital signal and the delayed first and second digital input signals to generate the digital control signal.

32. The predistortion linearizer of claim 24, wherein again of the gain control signal is set according to a gain of a delayed first and second digital input signals, an output level of the amplifier circuit estimated by using a feedback signal, and a desired amplifier output level.

* * * * *